United States Patent [19]
Edler

[11] Patent Number: 4,888,562
[45] Date of Patent: Dec. 19, 1989

[54] LOW NOISE, HIGH SPEED CURRENT OR VOLTAGE AMPLIFIER

[75] Inventor: Peter A. Edler, Los Altos, Calif.

[73] Assignee: National Semiconductor Corporation, Santa Clara, Calif.

[21] Appl. No.: 94,861

[22] Filed: Sep. 9, 1987

[51] Int. Cl.⁴ .......................... H03F 1/14; H03F 3/08
[52] U.S. Cl. .................................. 330/291; 330/292; 330/308; 330/300
[58] Field of Search ................. 330/59, 291, 300, 290, 330/294, 296, 311, 308, 292; 455/619

[56] References Cited

U.S. PATENT DOCUMENTS

3,720,879  3/1973  Reitmeyer, Jr. ............... 330/292 X
4,688,267  8/1987  Chown et al. ................. 330/308 X
4,792,998  12/1988 Toussaint ........................ 455/619

*Primary Examiner*—Steven Mottola
*Attorney, Agent, or Firm*—Flehr, Hohbach, Test, Albritton & Herbert

[57] ABSTRACT

A low noise, high speed current transimpedance amplifier system (20) includes AC bootstrapping for the photodiode D1 by capacitor C2 connected between the source of the JFET Q1 and the cathode of the photodiode D1 by line (56). Line (58) also provides AC bootstrapping to the case of the module (40) through capacitor C2. Similarly, the source resistor R3 and drain of JFET Q1 are AC bootstrapped through capacitors C1 and C4 to the emitters of the transistors Q2 and Q4 by lines (60) and (62). The collectors of the second stage transistors Q2 and Q4 are bootstrapped to the third stage transistor Q3 emitter through capacitor C8 by line (64). This bootstrapping reduces the effective input capacitance at the front end of the amplifier system (20) by a factor of up to about 100, thus reducing signal noise component in the subsequent stage or stages to negligible compared to front end noise.

36 Claims, 7 Drawing Sheets

| 3A | 3B |

LOW NOISE, HIGH SPEED CURRENT OR VOLTAGE AMPLIFIER

BACKGROUND OF THE INVENTION

1. Field of the Invention

This invention relates to an amplifier system for pre-amplifying a current or voltage waveform. More particularly, it relates to such an amplifier system for amplifying such waveforms of the type that are received from optical sensors, such as photodiodes or avalanche photodiodes. Most especially, it relates to such an amplifier system for pre-amplifying such a current waveform to form a voltage waveform, i.e. a transimpedance amplifier system.

2. Description of the Prior Art

In many optoelectronic applications, junction field effect transfer (JFET) into bipolar cascode amplifiers have become somewhat of a standard for low noise/high speed front ends, primarily because their immediate voltage gain desensitizes them to later stage noise voltage contributions. Other amplifier configurations are also used for these applications. Examples of prior art amplifier systems for such applications are disclosed in, for example, D.R. Smith et al., "High Performance Digital Optical Receivers with PIN Diodes," *Proceedings of 1979 ISCAS*, pp. 511–513 and M. J. N. Sibley et al., "A Monolithic Common-Collector Front-End Optical Preamplifier," *Journal of Lightwave Technology*, Vol. LT-3, No. 1, February 1985, pp. 13–15. To minimize noise over a wide bandwidth, input capacitance squared divided by the JFET transconductance ($C_T^2/g_m$) is kept small, as are photodiode and JFET leakage currents. Feedback resistor impedance ($R_L$) is selected large so that its thermal noise current is small. Unfortunately, the bandwidth is a function of $C_T$ and $R_L$ and can become quite small for large $R_L$ and difficult to deal with in closed loop designs. Another disadvantage of the cascode front end is that recovery from amplifier saturation is hindered because some of the peak-to-peak voltage swing to remove charge from $C_T$ through $R_L$ is taken up biasing the second transistor. This is important in applications, such as bar code scanning, where the detector is exposed to signals with a wide dynamic range and ambient light.

SUMMARY OF THE INVENTION

Accordingly, it is an object of this invention to provide an improved low noise, high speed amplifier system suitable for use in light detection applications.

It is another object of the invention to provide such a low noise, high speed amplifier system suitable for use in scanning applications.

It is still another object of the invention to provide a low noise, high speed amplifier system having a reduced input capacitance compared to previous such amplifier systems and which is capable of a quick recovery from saturation.

It is a further object of the invention to provide such a low noise, high speed amplifier system which is capable of overcoming the above limitations of cascode amplifiers without sacrificing noise or bandwidth performance.

The attainment of these and related objects may be achieved through use of the novel low noise, high speed amplifier system herein disclosed. A low noise, high speed amplifier system in accordance with this invention has a first amplifier, for example, a front end transistor with a control electrode, an input current flow electrode and an output current flow electrode and an input signal source connected to the control electrode of the front end transistor. The output current flow electrode of the front end transistor is alternating current coupled to at least one contributor, preferably all or most of the contributors, of an effective input capacitance of the amplifier system to reduce the effective input capacitance of the amplifier system. As used herein, the terms "alternating current coupled" and "coupled" refer to direct connections, connections through non-unity voltage gain amplifiers, subsequent stage amplifiers, and near unity gain passive components, such as capacitors. A second amplifier, for example, a second stage transistor having a control electrode, an input current flow electrode and an output current flow electrode has its control electrode connected to the output current flow electrode of the front end transistor. The output current flow electrode of the second stage transistor is alternating current coupled to the input current flow electrode of the front end transistor. This bootstrapping, in conjunction with other bootstrapping described herein, reduces the effective input capacitance at the front end of the amplifier system by a factor of up to and exceeding, for example, about 100, thus reducing signal noise component in the subsequent stage or stages to negligible compared to front end noise.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Figure 1:
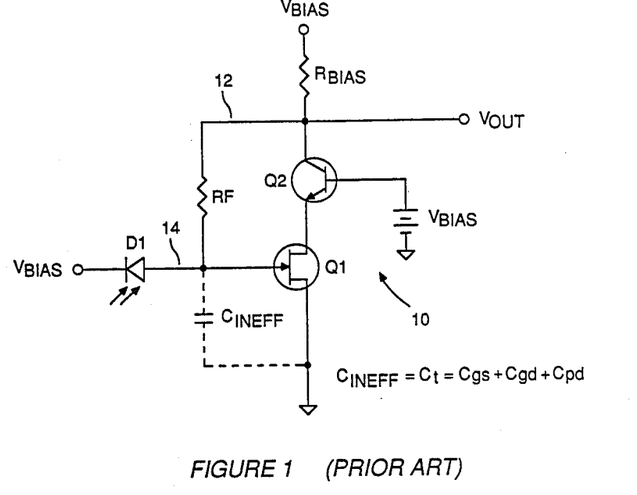
FIG. 1 is a schematic representation of a prior art amplifier for optoelectronic applications.

In FIG. 1, there is shown a prior art JFET front end, cascode amplifier 10 commonly used in optoelectronic applications. Impedance Rf provides a feedback loop on line 12 between a collector of transistor Q2 and a gate of the JFET Q1 in the cascode pair amplifier 10. At the front end is an effective input capacitance Cineff of about 6 picofarads (pf), including $C_{gs}+C_{gd}+C_{pd}$. Photodiode D1 provides an input signal to be amplified on line 14 to the amplifier 10. Using a source-follower, or common drain, in the front end of the amplifier 10, a known technique, allows the gate-source capacitance $C_{gs}$ to be effectively eliminated. However, because it is necessary to use a relatively high resistance for Rf, such as about 20 megohm, in order to reduce thermal noise in the resistor, one would also have to reduce the gate-drain and photodiode capacitances $C_{gd}$ and $C_{pd}$ in order to significantly increase the high frequency gain of the amplifier 10.

Another disadvantage of the cascode amplifier 10 in FIG. 1 is that part of the output voltage swing for removing charge from the effective input capacitance when the amplifier is saturated is taken up to bias the second transistor Q2 in the amplifier 10. This means that recovery of the amplifier 10 from saturation takes longer than would be the case with a wider voltage swing.

Figure 2:
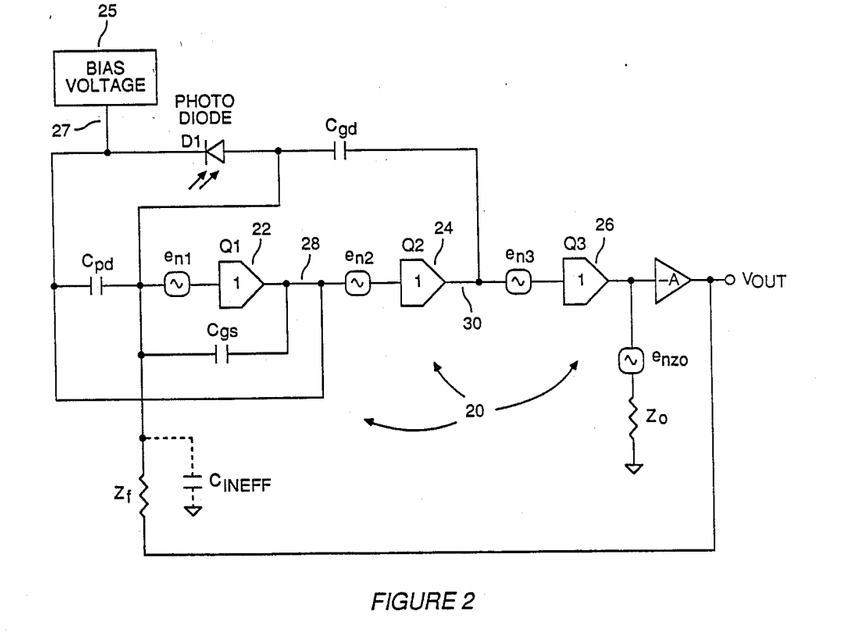
FIG. 2 is a block diagram and schematic representation of a low noise, high speed transimpedance amplifier system in accordance with the invention.

FIG. 2 shows an amplifier system 20 of this invention in which effective input capacitance is bootstrapped to reduce it to a negligible value. In comparison with the amplifier 10 of FIG. 1, effective input capacitance Cineff is reduced from about 6 pf to about 0.1 pf, including the capacitance of the feedback impedance $Z_f$. In the amplifier system 20, three emitter follower transistor stages are represented by amplifiers 22, 24 and 26 with unit gain. A bias voltage source 25 is connected to the cathode of photodiode D1 by line 27. Because the bias end of the photodiode is ac bootstrapped with output 28 of the JFET Q1 amplifier 22, photodiode capacitance $C_{pd}$ appears as shown from the gate to the source of the JFET Q1. Similarly, the drain of the JFET Q1 is ac bootstrapped with output 30 of transistor Q2 amplifier 24, so that gate to drain capacitance $C_{gd}$ appears as shown. This ac bootstrapping effectively reduces all noise voltage contributions beyond the second stage amplifier 24 to be negligible, by putting the noise voltage contributions across the effective bootstrapped input capacitance ($\sim C_t/100$), instead of $C_t$.

Notice that the input noise voltage $e_{n1}$ of the first stage 22 appears across $C_{pd}$, $C_{gs}$ and $C_{gd}$, while the input noise voltage $e_{n2}$ of the second stage 24 appears only across $C_{gd}$. The currents generated from these sources are:

$$i_{cpd} = \frac{e_{n1}}{Z_{Cpd}} = \text{noise current due to } e_n\text{'s in } C_{pd}.$$

$$i_{cgs} = \frac{e_{n1}}{Z_{Cgs}} = \text{noise current due to } e_n\text{'s in } C_{gs}.$$

$$i_{cgd} = \frac{(e_{n1}^2 + e_{n2}^2)^{1/2}}{Z_{Cgd}} = \text{noise current due to } e_n\text{'s in } C_{gd}.$$

If $e_{n2} << e_{n1}$, then:

$$i_{en} \simeq \frac{e_{n1}}{Z_{Ct}} + \frac{(e_{n2}^2 + e_{n3}^2 + e_{nzo}^2)^{1/2}}{Z_f || Z_{Cteff}} \simeq \frac{e_{n1}}{Z_{Ct}}$$

where:

$i_{en}$ = total input noise current due to $e_n$'s $C_t$ = total input capacitance = $C_{pd} + C_{gs} + C_{gd}$ $C_{teff}$ = total effective input capacitance $= \frac{C_t}{\text{Bootstrap reduction}} \simeq \frac{C_t}{100}$ Therefore, further stage $e_n$ noise components are reduced to negligible when compared to that of the first stage.

Figures 3, 3A:
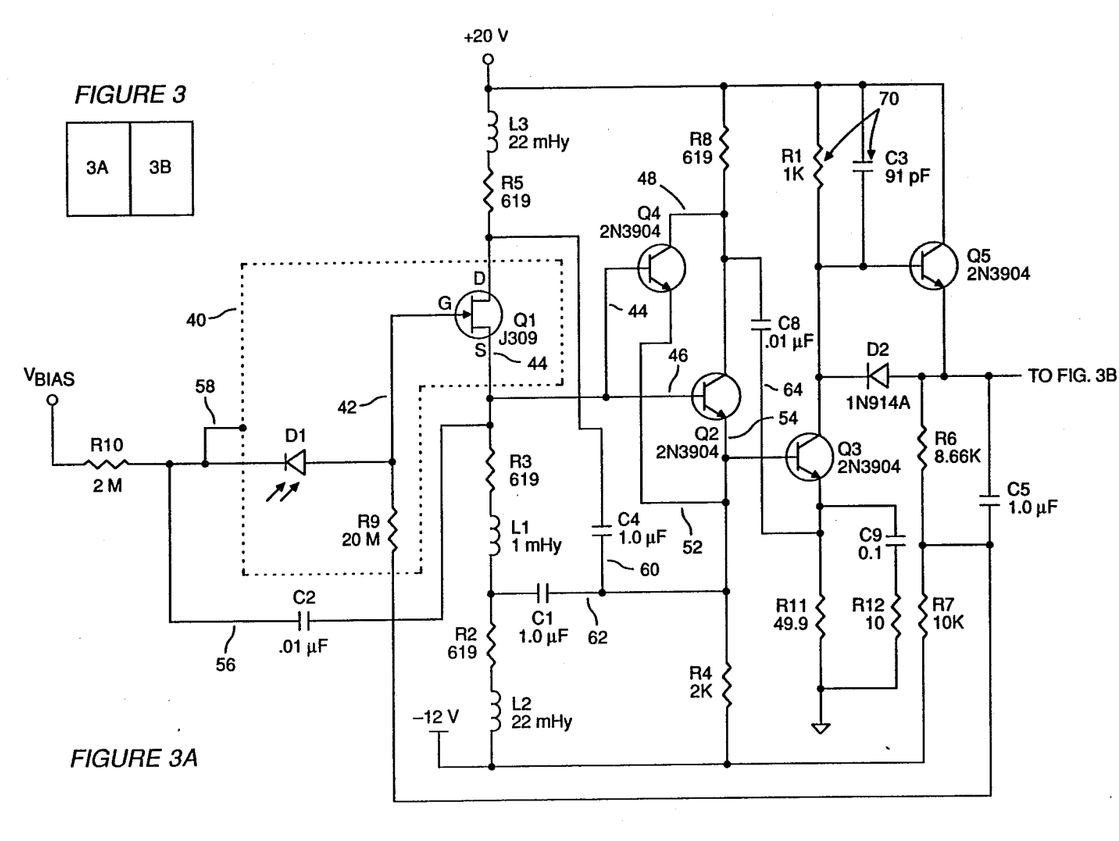
FIG. 3 is a key showing placement of FIGS. 3A and 3B.
FIGS. 3A and 3B are a more detailed schematic diagram of the low noise, high speed transimpedance amplifier system of FIG. 2.
Figure 3B:
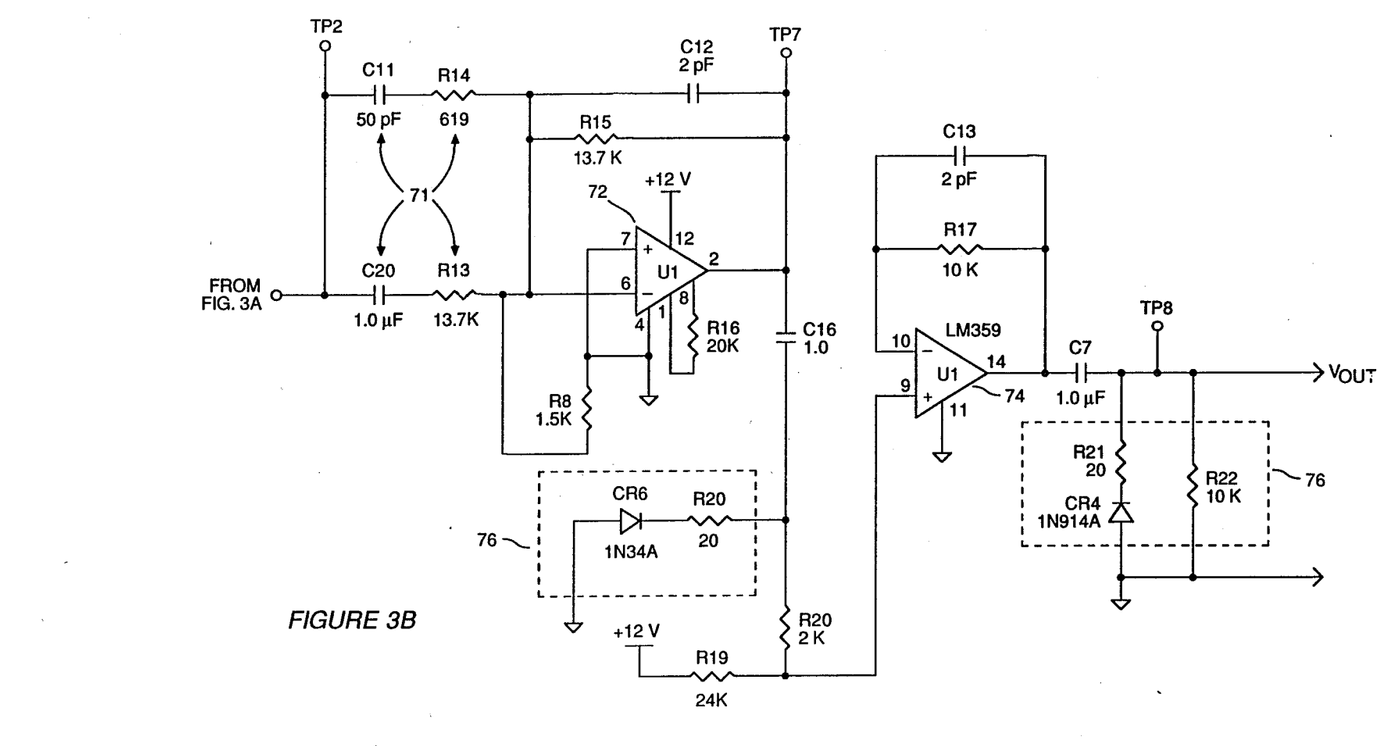

FIGS. 3A and 3B show details of an implementation of the amplifier system 20. Front end JFET Q1 and a feedback chip resistor R9, which may be between about 0.8 and 100 megohms, preferably about 20 megohms as shown, are enclosed with the photodiode D1 in a windowed hybrid package, as indicated at 40, so that parasitic capacitances are minimized and summing junction 42 is protected from radiated EMI. The chip resistor R9 is preferably provided in non-serpentine form, selected for high ohms per square and low shunt capacitance and mounted un-trimmed on a substrate to minimize and control shunt capacitance. Trimming such a resistor increases its capacitance by thinning it structure. The JFET Q1 is selected and biased to provide minimum $C_t^2/g_m$ and low leakage. The photodiode is selected and biased for maximum responsivity and minimum capacitance and leakage for the particular application.

The second stage transistor Q2 has its base connected to a source of the JFET Q1 by line 46. The second stage transistor Q2 is selected for low noise voltage ($e_n$), low base spreading resistance ($r_b$), and low input capacitance. To lower $r_b$ further, transistor Q4 can be connected in parallel with transfer Q2 by lines 44, 48 and 52. Transistor Q3 has its base connected to the emitters of transistors Q2 and Q4 by lines 52 and 54. The third stage transistor Q3 is selected for low input capacitance to minimize Miller effect loading on the second stage transistors Q2 and Q4.

The AC bootstrapping in accordance with this invention is provided for the photodiode D1 by a 0.01 $\mu$f capacitor C2 connected between the source of the JFET Q1 and the cathode of the photodiode D1 by line 56. Line 58 also provides AC bootstrapping to the case of the hybrid module 40 through capacitor C2. Similarly, the source resistor R3 and drain of JFET Q1 are AC bootstrapped through the 1.0 $\mu$f capacitors C1 and C4 to the emitters of the transistors Q2 and Q4 by lines 60 and 62. The collectors of the second stage transistors Q2 and Q4 are bootstrapped to the third stage transistor Q3 emitter through capacitor C8 by line 64.

Inductors L1, L2 and L3 are employed with the first stage JFET Q1 to increase the bootstrap efficiency, yet allow high JFET bias current for maximum JFET $g_m$. They also act to reduce the thermal noise of the adjacent resistors R2, R3 and R5.

Open loop compensation is carried out with the third stage transistor Q3 by compensation circuit 70. Diode D2 improves negative slew rate.

Discrete stage output swing can be from the positive supply rail (Vcc) to ground, if the dark level is designed to be near Vcc. This allows the amplifier system 20 to remove charge from a saturated front end $C_t$ at a rate approaching Vcc/$R_f$, where $Z_f$ is a resistor. Video clamps 76 provide clamping of the dark level. Bandpass filtering to reject out of band noise is done elsewhere in the system.

Figure 4:
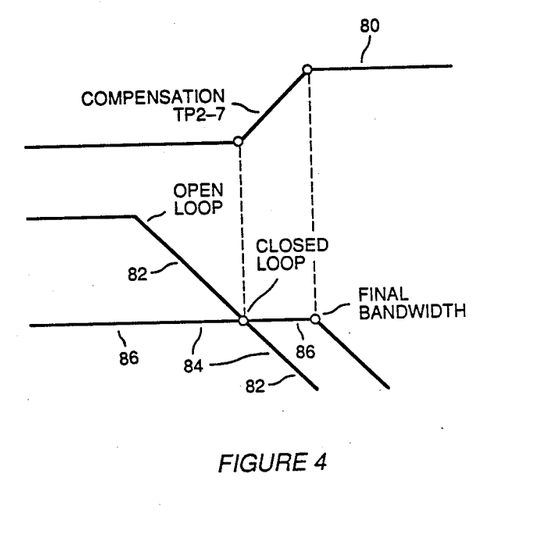
FIG. 4 is a plot of gain against frequency for the amplifier system of FIGS. 3A–3B.

Operational amplifier stages 72 and 74 provide for gain and frequency compensation to cancel the single discrete closed loop pole due to $R_f$ in parallel with its shunt capacitance. FIG. 4 is a plot of gain versus frequency in the preamplifier system 20 and shows the frequency compensation of the system. Curve 82 shows the open loop gain of the discrete stages up to test point (TP) 2. Line 84 shows the closed loop gain at TP 2 after connecting feedback resistor R9. Curve 80 shows lead compensation due to network 71 in FIG. 3B. Curve 86 shows the final compensated bandwidth of the preamplifier system.

Figure 5:
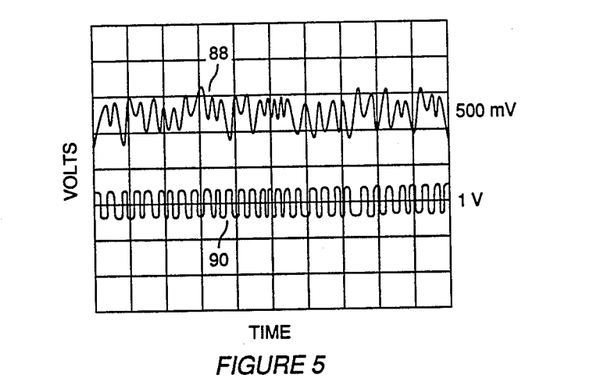
FIGS. 5, 6 and 7 are waveform diagrams useful for understanding operation of the low noise, high speed transimpedance amplifier system of FIGS. 2-3B.

FIG. 5 is a plot of voltage against time for the preamplifier system 20 during scanning of a test bar code label with a Datachecker BDI Scanner having the preamplifier system 20 installed. Curve 88 shows the voltage at TP 2, prior to amplification by operational amplifier 72. Curve 90 shows the voltage at TP 7, after amplification by the operational amplifier 72. These curves show that the amplifier system 20 produces clear signals in response to scanning a bar code.

Figure 6:
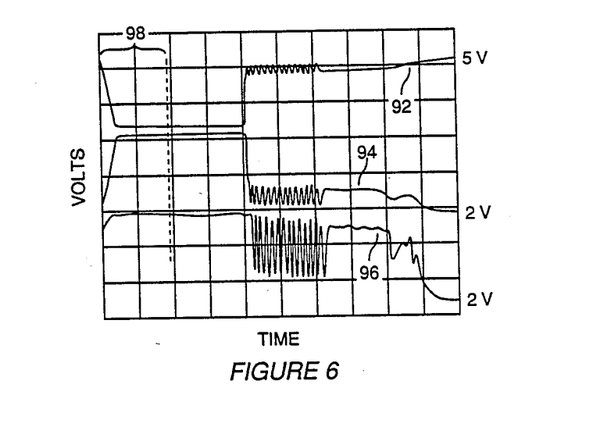
Figure 7:
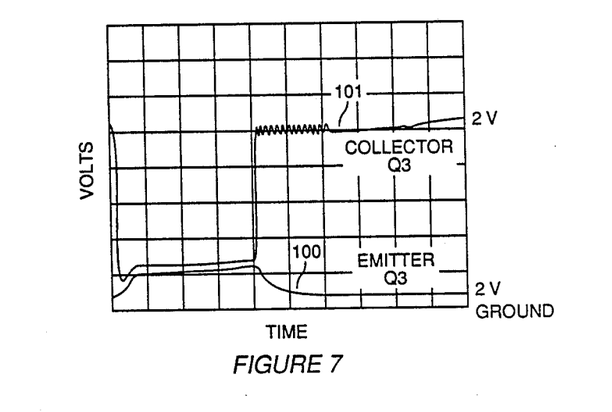

FIG. 6 is a plot of voltage against time when the Datachecker scanner with the preamplifier system 20 installed scans a label with a 1¾ inch white border right after a 100 watt incandescent lamp 2 ft. away from the scanner surface. Such ambient light levels are sometimes encountered in scanner installations. Curve 92 shows the voltage at TP2, curve 94 the voltage at TP7, and curve 96, as the final filtered video output. Region 98 on each curve represents the signal at saturation of the amplifiers due to the incandescent light. These curves show that the amplifier system 20 has recovered from saturation by the time that the scanner reaches the bar code on the label. Curve 100 in FIG. 7 is a similar plot showing the voltage at R11, i.e., at the emitter output of the third stage transistor Q3. Curve 101 shows the voltage at the collector of transistor Q3.

Figure 8:
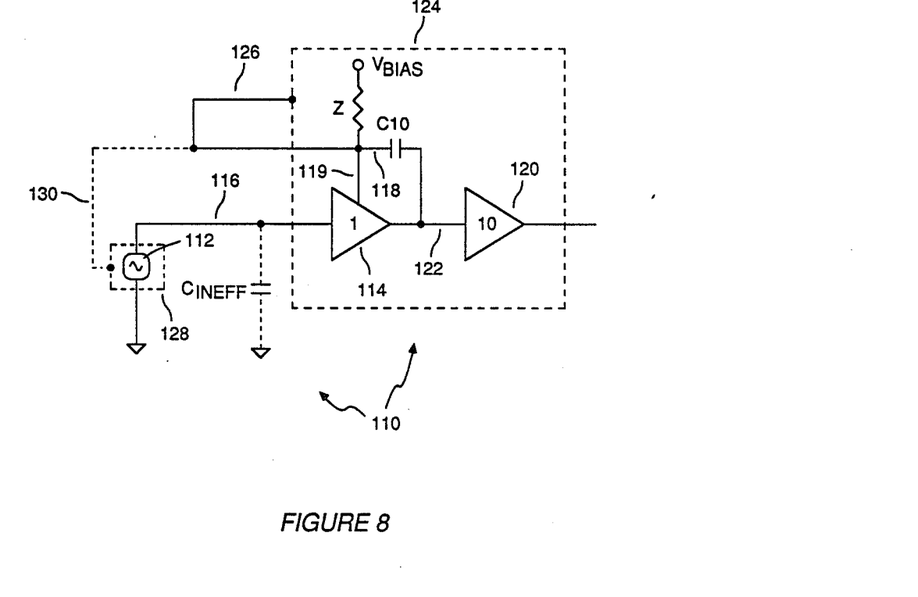
FIG. 8 is a block diagram of another embodiment of an amplifier system in accordance with the invention.

FIG. 8 shows an FET probe voltage amplifier system 110. A voltage source 112 is connected to a control electrode of unity gain amplifier 114 by line 116. The signal output of the amplifier 114 is AC coupled by capacitor C10 on line 118 to a bias voltage input to the amplifier 114 on line 119. The signal output of amplifier 114 is connected to a control electrode of amplifier 120 having a gain of, for example, 10 by line 122. The amplifiers 114 and 120 are packaged in a case 124. The signal output of amplifier 114 is also AC coupled by capacitor C10 to the case on line 126 and optionally to case 128 of the voltage source 112 by line 130. By reducing the effective input capacitance Cineff of the amplifier 110 in this manner, a low noise, high speed amplifier system 110 suitable for FET probe applications is obtained.

Figure 9:
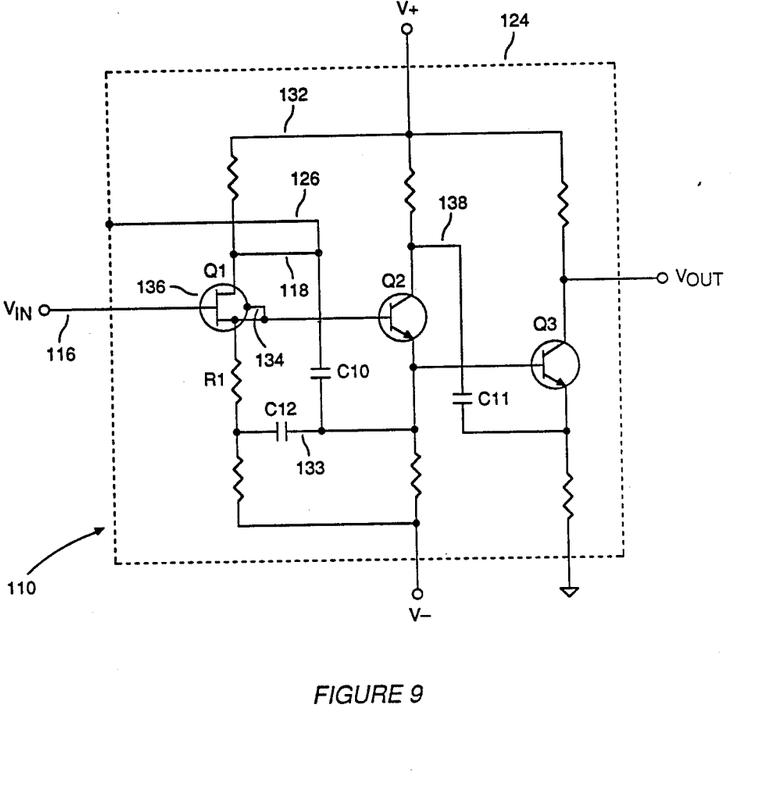
FIG. 9 is a schematic diagram of the amplifier system shown in FIG. 8.

FIG. 9 shows a specific circuit implementation of the amplifier system 110. The input voltage on line 116 is supplied to the gate of a front end JFET Q1. As a source follower, the output at the source of the JFET Q1 is connected to the base of bipolar transistor Q2. The emitter of bipolar transistor Q2 is ac coupled by capacitor C10 on line 118 to the drain of the JFET Q1, which receives a bias voltage on line 132. Bias resistor R1 for the source of the JFET Q1 is bootstrapped to the emitter of transistor Q2 on line 133. Line 126 connects the capacitor C10 to the case 124 of the amplifier system 110. Line 134 connects the source of JFET Q1 to the case 136. The emitter of the bipolar transistor Q2 is similarly connected to the base of bipolar transistor Q3, and the emitter of the transistor Q3 is ac coupled to the collector of transistor Q2 by capacitor C11 on line 138. The output of the amplifier system 110 is at the collector of transistor Q3. In addition to its use as a FET probe, the amplifier system 110 is useful for other applications of a low noise, high speed voltage amplifier.

Various modifications can be made in the amplifier systems 20 and 110. Other types of transistors, such as MESFETs, gallium arsenide FETs, MOSFETs or bipolar transistors, could be substituted for the front end JFET Q1 or the bipolar transistors Q2, Q3 or Q4. Part or all of the remainder of the amplifier system 20 could be enclosed in a larger hybrid package than the module 40, with the modification or deletion of circuit elements that do not hybridize well, such as inductors and capacitors. Similarly, part or all of the amplifier system 20 could be implemented in integrated circuit form, such as a combined bipolar-FET (BiFET) integrated circuit, or an all bipolar integrated circuit, or a gallium arsenide FET integrated circuit, with the modification or deletion of circuit elements, such as inductors or capacitors, which are not compatible with the monolithic process. In addition to the scanning application and the particular transducers used, the amplifier system 20 is equally useful in other applications and with other transducers where low capacitance is needed, such as in a low capacitance FET probe, current probe, or an RF detector. It could also be used to make an instrumentation amplifier, high speed buffer operational amplifier, or used as the front end of an operational amplifier.

It should now be readily apparent to those skilled in the art that a novel low noise, high speed current or voltage amplifier system capable of achieving the stated objects of the invention has been provided. The low noise, high speed amplifier system of this invention is suitable for a variety of light detection applications, such as scanners for bar codes or other signal inputs. The amplifier system is responsive to a relatively high frequency varying input, and recovers quickly from saturation. The amplifier system is therefore capable of overcoming limitations of prior art cascode amplifiers used in scanner applications.

It should further be apparent to those skilled in the art that various changes in form and details of the invention as shown and described may be made. It is intended that such changes be included within the spirit and scope of the claims appended hereto.

What is claimed is:

1. An amplifier system, which comprises a front end transistor having a control electrode, an input current flow electrode and an output current flow electrode, first coupling means for alternating current coupling the output current flow electrode of said front end transistor to at least one contributor of an effective input capacitance of said amplifier system to reduce the effective input capacitance of said amplifier system, a second stage transistor coupled to said front end transistor having a control electrode, an input current flow electrode and an output current flow electrode, second coupling means for coupling the output current flow electrode of said front end transistor to the control electrode of said second stage transistor, and third coupling means for alternating current coupling the output current flow electrode of said second stage transistor to the input current flow electrode of said front end transistor to reduce the effective input capacitance of said amplifier.

2. The amplifier system of claim 1 additionally comprising a third stage transistor coupled to said second stage transistor having a control electrode and two current flow electrodes, means for coupling the control electrode of said third stage transistor to the output current flow electrode of the second stage transistor, and means for alternating current coupling the output current flow electrode of said third stage transistor to the input current flow electrode of said front end or second transistor to reduce the effective input capacitance of said amplifier system.

3. The amplifier system of claim 2 in which said front end transistor comprises a field effect transistor and said second and third stage transistors comprise bipolar transistors.

4. The amplifier system of claim 1 additionally comprising an additional second stage transistor connected in parallel with said second stage transistor.

5. The amplifier system of claim 1 in which said front end transistor comprises a field effect transistor and said second stage transistor comprises a bipolar transistor.

6. The amplifier system of claim 1 in which said amplifier system additionally includes a source of an input signal connected to the control electrode of said front end transistor, and in which the input signal provided by said source is a current waveform and said amplifier system is configured to provide a voltage waveform at the output of said amplifier system.

7. The amplifier system of claim 6 in which said source of an input signal is a photodiode.

8. The amplifier system of claim 7 in which said first coupling means alternating current couples the output current flow electrode of said front end transistor to an electrode of said photodiode as a contributor to the effective input capacitance of said amplifier system.

9. The amplifier system of claim 8 in which at least one of said front end transistor and said photodiode are provided in a case, said system further including means for alternating current coupling the output current flow electrode of said front end transistor additionally to said case as a contributor to the effective input capacitance of said amplifier system.

10. The amplifier system of claim 9 in which said front end transistor and said photodiode are provided as a hybrid circuit in said case.

11. The amplifier system of claim 1 additionally comprising a resistive and capacitive network compensation circuit connected to receive an output signal from said amplifier system.

12. The amplifier system of claim 11 additionally comprising a diode connected to supply the output signal from said amplifier system to said compensation circuit.

13. The amplifier system of claim 1 additionally comprising a first operational amplifier coupled to said second stage transistor with an input coupled to receive an output signal from said second stage transistor, a second operational amplifier coupled to said first operational amplifier with an input coupled to receive an output signal from said first operational amplifier, a first video clamping diode circuit connected between said first operational amplifier and the input of said second operational amplifier, and a second video clamping diode circuit coupled to an output of said second operational amplifier.

14. The amplifier system of claim 1 in which at least one of said first coupling means and said third coupling means includes a capacitor.

15. The amplifier system of claim 1 including a sequence of coupled stage transistors, a bias element coupled to the input or output current flow electrode of one of said stage transistors, and means for alternating current coupling said bias element to the output electrode of a subsequent one of said stage transistors.

16. The amplifier system of claim 15 including a bias resistor coupled to the output current flow electrode of said front end transistor, and means for coupling the output electrode of said second stage transistor to said bias resistor.

17. The amplifier system of claim 1 in which said front end transistor is connected as an amplifier having a substantially unit voltage gain.

18. The amplifier system of claim 17 in which said second stage transistor is connected as an amplifier having a substantially unity voltage gain.

19. The amplifier system of claim 17 in which said second stage transistor is connected as an amplifier having a greater than unity voltage gain.

20. The amplifier system of claim 1 in which said amplifier system additionally includes a source of an input signal connected to the control electrode of said front end transistor, a case which houses said source of an input signal, and means for alternating current coupling said front end transistor to the case of said source of an input signal to reduce the effective input capacitance of said amplifier.

21. The amplifier system of claim 1 including a case which houses said front end transistor, and means for alternating current coupling the signal output of said front end transistor to the case of said front end transistor to reduce the effective input capacitance of said amplifier.

22. An amplifier system, which comprises a first amplifier having a control input, a current flow input and a current flow output, first coupling means for alternating current coupling the current flow output of said first amplifier to at least one contributor of an effective input capacitance of said amplifier system to reduce the effective input capacitance of said amplifier system, a second amplifier coupled to said first amplifier having a control input, a current flow input and a current flow output, second coupling means for coupling the current flow output of said first amplifier to the control input of said second amplifier, and third coupling means for alternating current coupling the current flow output of said second amplifier to at least one contributor of an effective input capacitance of said first amplifier to reduce the effective input capacitance of said amplifier system.

23. The amplifier system of claim 22 additionally comprising a third amplifier coupled to said second amplifier having a control input, a current flow input and a current flow output, means for coupling the control input of said third amplifier to the current flow output of the second amplifier, means for alternating current coupling the current flow output of said third amplifier to at least one contributor of an effective input capacitance of said first or second amplifier to reduce the effective input capacitance of said amplifier system.

24. The amplifier system of claim 22 in which said amplifier system additionally includes a source of an input signal connected to the control input of said first amplifier, and in which the input signal provided by said source of an input signal is a current waveform and said amplifier system is configured to provide a voltage waveform at the output of said amplifier system.

25. The amplifier system of claim 24 in which said source of an input signal comprises a photodiode.

26. The amplifier system of claim 25 including means for coupling the output current flow electrode of said first amplifier to an electrode of said photodiode as a contributor to the effective input capacitance of said amplifier system.

27. The amplifier system of claim 25 in which at least one amplifier and said photodiode are provided in a case, said amplifier system further including means for alternating current coupling the output current flow electrode of said front end transistor additionally to said case as a contributor to the effective input capacitance of said amplifier system.

28. The amplifier system of claim 27 in which said first amplifier and said photodiode are provided as a hybrid circuit in a case.

29. The amplifier system of claim 22 additionally comprising a resistive and capacitive network compensation circuit connected to receive an output signal from said amplifier system.

30. The amplifier system of claim 29 comprising a diode connected to supply the output signal from said amplifier system to said compensation circuit.

31. The amplifier system of claim 22 additionally comprising a first operational amplifier coupled to said second amplifier with an input coupled to receive an output signal from said second amplifier, a second operational amplifier coupled to said first operational amplifier with an input coupled to receive an output signal from said first operational amplifier, a first video clamping diode circuit connected between said first operational amplifier and the input of said second operational amplifier, and a second video clamping diode circuit coupled to an output of said second operational amplifier.

32. The amplifier system of claim 22 including a bias impedance coupled to the current flow output of said first amplifier, and means for coupling the current flow output of said second amplifier to said bias impedance to reduce the effective input capacitance of said amplifier system.

33. The amplifier system of claim 22 in which at least one of said first coupling means and said third coupling means includes a capacitor.

34. The amplifier system of claim 22 in which at least one of said first and second amplifiers additionally has a transistor connected in common collector or common drain configuration.

35. The amplifier system of claim 34 in which said first amplifier has said transistor connected in common drain configuration and said second amplifier has said transistor connected in common collector configuration.

36. An amplifier system comprising: a first amplifier having a control input, a signal input and a signal output, coupling means for alternating current coupling the signal output of said first amplifier to at least one contributor of an effective input capacitance of said amplifier to reduce the effective input capacitance of said amplifier; and a second amplifier coupled to said signal output of said first amplifier; said first amplifier having a voltage gain of unity and said second amplifier having a voltage gain greater than unit; at least one of said first amplifier and said second amplifier packaged in a case, said amplifier system including means for alternating current coupling the signal output of said amplifier to said case to reduce the effective input capacitance of said amplifier system.

* * * * *